United States Patent [19]
Shieh et al.

[11] Patent Number: 6,156,582
[45] Date of Patent: Dec. 5, 2000

[54] METHOD OF FABRICATING TOP EMITTING RIDGE VCSEL WITH SELF-ALIGNED CONTACT AND SIDEWALL REFLECTOR

[75] Inventors: Chan-Long Shieh, Paradise Valley; Michael S. Lebby, Apache Junction, both of Ariz.

[73] Assignee: Motorola, Inc., Schaumburg, Ill.

[21] Appl. No.: 08/075,934

[22] Filed: Jun. 14, 1993

[51] Int. Cl.[7] .................................................. H01L 21/00
[52] U.S. Cl. ................................ 438/29; 438/31; 438/39
[58] Field of Search .................................. 437/126, 127, 437/128, 129

[56] References Cited

U.S. PATENT DOCUMENTS

| | | | |
|---|---|---|---|
| 4,990,466 | 2/1991 | Shich et al. ..................... | 148/DIG. 95 |
| 5,034,344 | 7/1991 | Jewell et al. ..................... | 437/129 |
| 5,104,824 | 4/1992 | Clausen, Jr. et al. ............ | 148/DIG. 95 |
| 5,115,442 | 5/1992 | Lee et al. ......................... | 437/129 |
| 5,158,908 | 10/1992 | Blonder et al. ................. | 437/133 |

*Primary Examiner*—Kevin M. Picardat
*Attorney, Agent, or Firm*—Eugene A. Parsons

[57] ABSTRACT

A method of fabricating a ridge VCSEL having a first stack of mirrors, a second stack of mirrors and an active area sandwiched therebetween, including the steps of depositing a metal layer, an etchable layer and a masking layer on the second stack, removing portions of the masking layer, the etchable layer and the metal layer to form a mask, using the mask to etch the second stack to form a mesa, removing portions of the etchable layer to expose the metal layer, depositing an additional metal layer on the side of the mesa and the exposed portion of the metal layer to define a light emitting area, removing the etchable and masking layers to expose the metal layer in the light emitting area, and removing the exposed portion of the metal layer to expose the light emitting area.

12 Claims, 2 Drawing Sheets

METHOD OF FABRICATING TOP EMITTING RIDGE VCSEL WITH SELF-ALIGNED CONTACT AND SIDEWALL REFLECTOR

FIELD OF THE INVENTION

The present invention pertains to top emitting ridge vertical cavity surface emitting lasers (VCSEL) and more specifically to a method of fabricating VCSELs with self-aligned contacts and sidewall reflectors.

BACKGROUND OF THE INVENTION

Ridge, or top emitting mesa shaped, VCSELs are the preferred implementation over planar VCSELs because of the better current confinement and optical guiding. In the fabrication of top emitting VCSELs, the alignment of the top electrical contact to the light emitting area is very important. As an example, any internally generated light striking the electrical contact is reflected back into the laser and subsequently lost. Any misalignment of the electrical contact on the upper surface reduces the efficiency of the VCSEL. Further, the contact metal should cover the sidewall of the mesa as a reflector to reduce the optical loss and increase efficiency. Thus, any misalignment is detrimental to the VCSEL performance by blocking the intended emission and increasing the sidewall optical loss.

It is a purpose of the present invention to provide an improved method of fabricating VCSELs.

It is another purpose of the present invention to provide an improved method of fabrication VCSELs with self-aligned contacts and sidewall reflectors.

It is a further purpose of the present invention to provide an improved method of fabricating VCSELs with higher efficiency.

SUMMARY OF THE INVENTION

The above described problems and others are at least partially solved and the above purposes and others are realized in a method of fabricating a top emitting, ridge VCSEL including the steps of forming a first stack of mirrors and a second stack of mirrors with an active area sandwiched therebetween and the second stack of mirrors having an upper surface. Providing an etch mask defining the ridge VCSEL by forming a first metal contact layer on the upper surface of the second stack of mirrors, a layer of etchable material on the first metal contact layer and a layer of masking material on the layer of etchable material. The second stack of mirrors is then etched, using the etch mask, to form a ridge or mesa having a side surface. Portions of the layer of etchable material are removed to expose a first portion of the first metal contact layer and a second metal contact layer is deposited on the side surface of the ridge or mesa and the exposed first portion of the first metal contact layer to define a light emitting area. The layers of etchable and masking materials are then removed to expose a second portion of the first metal contact layer in the light emitting area and the exposed second portion of the first metal contact layer is removed to expose the light emitting area.

BRIEF DESCRIPTION OF THE DRAWINGS

Referring to the drawings.

DESCRIPTION OF THE PREFERRED EMBODIMENT

Figure 1:
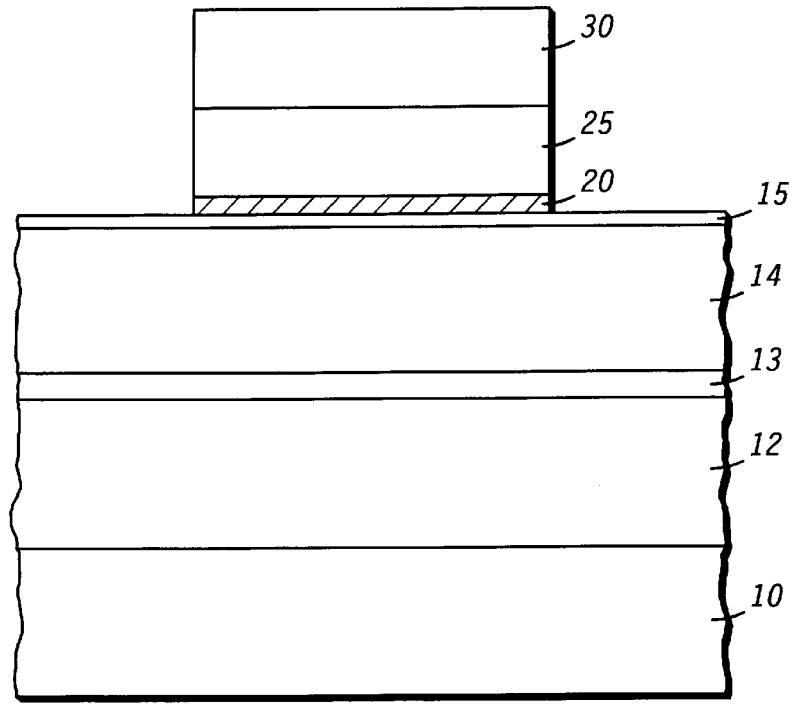
FIGS. 1–4 are simplified and greatly enlarged cross-sectional views illustrating several sequential steps in a method of fabricating VCSELs incorporating the present invention.

To better understand the present method of fabricating VCSELs, several sequential steps are illustrated in FIGS. 1–4. Referring specifically to FIG. 1, a substrate 10 of any convenient material is provided. Generally, substrate 10 is gallium arsenide (GaAs) or the like which, as will be understood presently, is compatible with layers subsequently grown thereon. A first stack of Bragg mirrors, which in this specific embodiment are n-type conductivity, are grown on an upper surface of substrate 10. An active area 13, generally containing a plurality of quantum wells and cladding regions on either side of the quantum wells, is grown on first stack of mirrors 12 and a second stack of Bragg mirrors 14, which in this specific embodiment are p-type conductivity, are grown on active area 13. Generally, first stack of mirrors 12, active area 13 and second stack of mirrors 14 are grown on substrate 10 epitaxially. The formation of first stack of mirrors 12, active area 13 and second stack of mirrors 14 is well known in the art and will not be elaborated upon further in this disclosure.

Generally, a thin heavily doped (p-type dopant) contact layer 15 of material, similar to one of the materials forming second stack of mirrors 14, is provided at the upper surface of second stack of mirrors 14. A first metal contact layer 20 is deposited on the upper surface of layer 15 and forms an ohmic contact therewith. In this specific embodiment metal contact layer 20 is formed of titanium tungsten (TiW) because it is convenient to deposit and is a p-type contact metal compatible with contact layer 15. A layer 25 of etchable material is deposited on metal contact layer 20 and a layer 30 of masking material is deposited on etchable layer 25. In this specific embodiment, layer 25 is formed of polyimide, which is easy to etch to a specific and desired depth. Layer 30 is formed of silicon oxynitride (SiON) or gold, either of which are relatively resistant to some etches used later in the process, as will be seen presently.

Layers 20, 25 and 30 are used as an etch mask later in the process and, as illustrated in FIG. 1, are formed to define the ridge, or mesa, of a VCSEL. Layers 20, 25 and 30 may be formed into an etch mask in one of at least two different ways or a combination of both ways. In a first series of steps, layers 20, 25 and 30 are deposited to cover contact layer 15. Using conventional lithography and reactive ion etch, layers 20, 25 and 30 are patterned into the illustrated etch mask with a vertical profile. In a second series of steps, layers 20, 25 and 30 are selectively deposited using, for example, conventional photoresist lift-off techniques.

Figure 2:
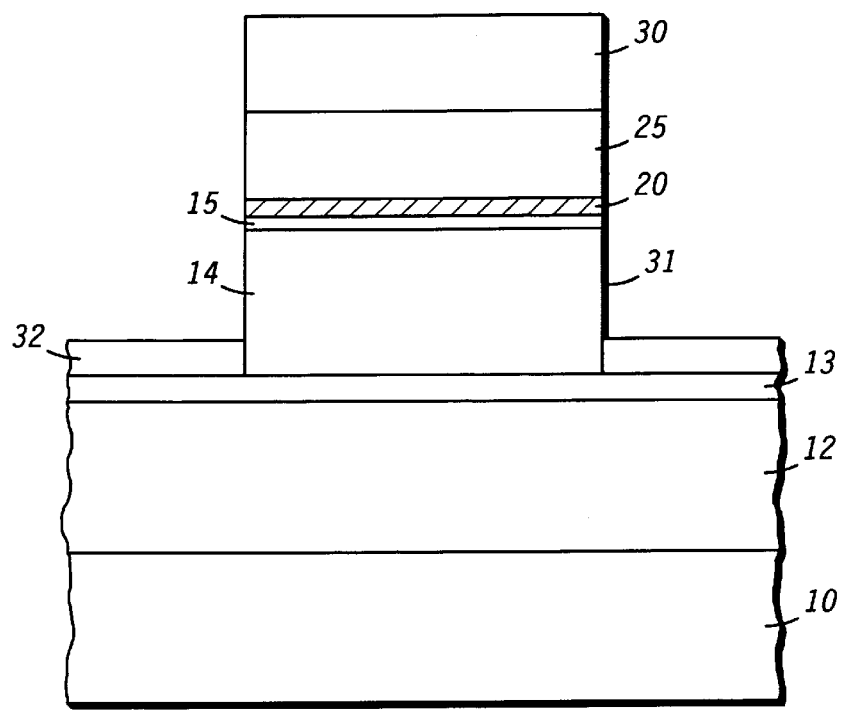

Once the etch mask is in place, contact layer 15 and second stack of mirrors 14 are etched to a predetermined depth, as illustrated in FIG. 2. In this etch step, any well known semiconductor etching process can be utilized, including chlorine reactive ion etch, chemically assisted ion beam etching, or the like. The profile of the etch is vertical and exposes sidewalls 31 of second mirror stack 14. It is important to stop this etch step before it touches active area 13 so that reliability is not compromised, see for example U.S. Pat. No. 5,034,092, entitled "Plasma Etching of Semiconductor Substrates" issued Jul. 23, 1991. In the embodiment illustrated in FIG. 2, the etch step is stopped short of the bottom of second mirror stack 14 to insure that it does not touch active area 13. An optional implant 32, which may be any convenient and compatible material, such as hydrogen or oxygen, is introduced to the remaining portion of second stack of mirrors 14 adjacent the defined ridge or mesa (sidewalls 31). Implant 32 reduces current spreading and, in conjunction with the ridge or mesa configuration, confines current in the VCSEL to substantially the lasing region.

Figure 3:
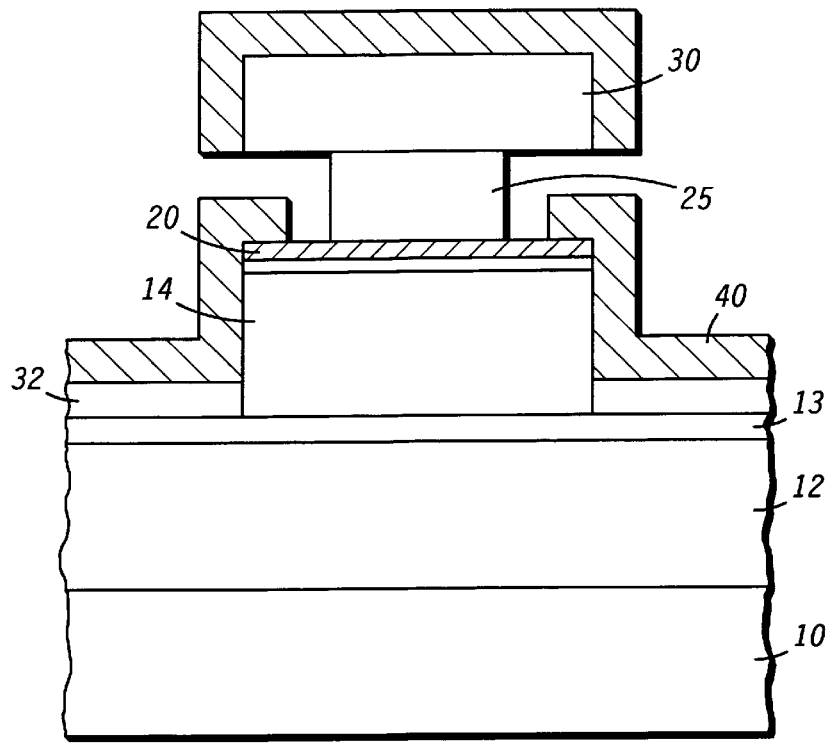

With the ridge or mesa formed and implant 32 in place, a portion of etchable layer 25 is removed to expose a first portion of metal contact layer 20, as illustrated in FIG. 3. A portion of etchable layer 25 is undercut, in this specific embodiment, in an oxygen plasma. The undercut removes approximately 1.5 to 2 $\mu$m immediately adjacent sidewalls 31. A relatively thick metal contact layer 40 is deposited over the entire structure, and especially on the exposed portions of metal contact layer 20 and sidewalls 31. The remaining portions of etchable layer 25 and layer 30 of masking material define the light emission window for the VCSEL and limit the deposition of metal contact layer 40 to outside the light emission window. In this specific embodiment, metal contact layer 40 is formed of a second layer of aluminum/titanium tungsten sputter deposited onto the first layer of titanium tungsten forming metal contact layer 20 and at least sidewalls 31. An alternate second layer which can be utilized is, for example, a sputtered or angled E-beam gold layer. Some of the metal contact layer 40 may also extend laterally outward away from the ridge or mesa to provide an area for receiving an external contact (not shown).

It will be understood by those skilled in the art that sputter deposition of metal into the undercut area between layers 20 and 30 generally follows a straight line path so that most of the undercut area is shadowed by layer 30 and no deposition will occur thereon. However, some limited deposition into the undercut area will occur and the amount of deposition (distance into the undercut area) is determined by the thickness of layer 25, or the distance between layers 20 and 30. Thus, when sputter deposition of contact metal layer 40 is performed the thickness of layer 25 accurately determines the definition of the light emission window or the amount of layer 20 which is covered by layer 40. If other metal deposition methods are used, such as angled E-beam, layer 25 can act as a mask on layer 20 and define the light emission window by directly limiting (masking) the amount of metal deposited in the undercut area.

Figure 4:
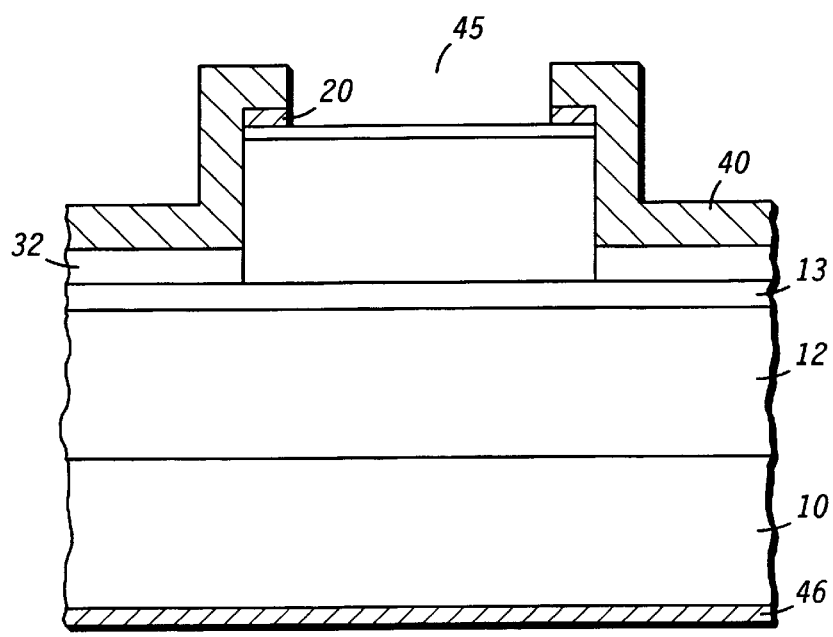

With metal contact layer 40 in place, layers 25 and 30, along with any portion of metal contact layer 40 deposited thereon, are removed, as illustrated in FIG. 4. The deep undercut in etchable layer 25 makes the use of a conventional lift off step possible in this removal. With the etch mask removed, the exposed portion of relatively thin metal contact layer 20 is removed to expose or open a light emission window 45 of the VCSEL. Exposed portions of metal contact layer 20 can be removed by etching, as for example by reactive ion etching. Finally, an n-metal contact 46 and a p-metal contact (not shown) are formed. In the specific embodiment illustrated in FIG. 4, n-metal contact 46 is deposited on the rear, or bottom, surface of substrate 10 but it will be understood that several configurations are available for placing both of the electrical contacts on the same side of the VCSEL.

Thus, an improved method of fabricating VCSELs is disclosed in which most of the steps of the method are self aligned and do not require lithographic alignment. Because of the self alignment, the positioning of the light emission window and the electrical contact is much more accurate. Also, because of the self alignment the method of fabricating VCSELs is simpler, easier to perform and has a higher efficiency. Further, the VCSELs manufactured are more efficient because the electrical contact is aligned more accurately and the side walls are covered with the metal contact layer which greatly reduces the optical loss.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a top emitting, ridge VCSEL comprising the steps of:

forming a first stack of mirrors and a second stack of mirrors with an active area sandwiched therebetween, the second stack of mirrors having an upper surface;

forming a first metal contact layer on the upper surface of the second stack of mirrors, a layer of etchable material on the first metal contact layer and a layer of masking material on the layer of etchable material so as to form an etch mask defining the ridge VCSEL;

etching the second stack of mirrors, using the etch mask, to form a ridge or mesa having a side surface;

removing portions of the layer of etchable material to expose a first portion of the first metal contact layer;

depositing a second metal contact layer on the side surface of the ridge or mesa and the exposed first portion of the first metal contact layer to define a light emitting area;

removing the layers of etchable and masking materials to expose a second portion of the first metal contact layer in the light emitting area; and removing the exposed second portion of the first metal contact layer to expose the light emitting area.

2. A method of fabricating a top emitting, ridge VCSEL comprising the steps of:

providing a substrate;

forming a first stack of mirrors on the substrate, an active area on the first stack of mirrors and a second stack of mirrors on the active area, the second stack of mirrors having an upper surface;

depositing a first metal contact layer on the upper surface of the second stack of mirrors so as to form an ohmic contact with the second stack of mirrors;

depositing a layer of etchable material on the first metal contact layer and a layer of masking material on the layer of etchable material;

selectively removing portions of the layer of masking material, the layer of etchable material and the first metal contact layer to form an etch mask defining the ridge VCSEL;

etching the second stack of mirrors, using the etch mask, to form a ridge or mesa having a side surface;

removing portions of the layer of etchable material to expose a first portion of the first metal contact layer;

depositing a second metal contact layer on the side surface of the ridge or mesa and the exposed first portion of the first metal contact layer to define a light emitting area;

removing the layers of etchable and masking materials to expose a second portion of the first metal contact layer in the light emitting area; and removing the exposed second portion of the first metal contact layer to expose the light emitting area.

3. A method of fabricating a top emitting, ridge VCSEL as claimed in claim 2 wherein the step of selectively removing portions of the layer of masking material, the layer of etchable material and the first metal contact layer to form an etch mask includes patterning by lithography and removing by reactive ion etching.

4. A method of fabricating a top emitting, ridge VCSEL as claimed in claim 3 wherein the step of etching the second stack of mirrors to form a ridge or mesa includes etching to a predetermined depth short of the active area by one of chlorine reactive ion etch and chemically assisted ion beam etching.

5. A method of fabricating a top emitting, ridge VCSEL as claimed in claim 4 including in addition a step of implanting a current confining impurity in a remaining portion of the second mirror stack using the etch mask.

6. A method of fabricating a top emitting, ridge VCSEL as claimed in claim 5 wherein the step of implanting includes implanting one of hydrogen and oxygen.

7. A method of fabricating a top emitting, ridge VCSEL as claimed in claim 2 wherein the step of depositing a first metal contact layer includes depositing a layer including titanium tungsten.

8. A method of fabricating a top emitting, ridge VCSEL as claimed in claim 2 wherein the step of depositing a layer of etchable material includes depositing a layer of polyimide.

9. A method of fabricating a top emitting, ridge VCSEL as claimed in claim 8 wherein the step of depositing a layer of masking material includes depositing a layer of silicon oxynitride.

10. A method of fabricating a top emitting, ridge VCSEL as claimed in claim 9 wherein the step of removing a portion of the etchable material includes undercutting the layer of silicon oxynitride in an oxygen plasma.

11. A method of fabricating a top emitting, ridge VCSEL as claimed in claim 10 wherein the step of depositing a second metal contact layer includes depositing a layer including titanium tungsten.

12. A method of fabricating a top emitting, ridge VCSEL as claimed in claim 11 wherein the step of removing the layers of polyimide and silicon oxynitride includes a liftoff process.

* * * * *